United States Patent
Chen

(10) Patent No.: US 9,667,212 B2
(45) Date of Patent: May 30, 2017

(54) GAIN CONTROL METHOD, MODULE, AND WIRELESS SIGNAL RECEIVER USING THE SAME

(71) Applicant: ISSC Technologies Corp., Hsinchu (TW)

(72) Inventor: Peng-Sen Chen, Hsinchu County (TW)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 303 days.

(21) Appl. No.: 14/447,321

(22) Filed: Jul. 30, 2014

(65) Prior Publication Data

US 2015/0303959 A1    Oct. 22, 2015

(30) Foreign Application Priority Data

Apr. 16, 2014   (TW) .............................. 103113889 A

(51) Int. Cl.
| | |
|---|---|
| *H03G 3/20* | (2006.01) |
| *H04B 1/12* | (2006.01) |
| *H03G 3/30* | (2006.01) |

(52) U.S. Cl.
CPC ............. *H03G 3/20* (2013.01); *H03G 3/3078* (2013.01); *H04B 1/126* (2013.01)

(58) Field of Classification Search
CPC .... H03G 3/3078; H03G 3/3068; H04L 27/22; H04B 1/713; H04N 5/4401; H04N 5/52; H04W 52/0219; H03B 5/1228
See application file for complete search history.

(56) References Cited

U.S. PATENT DOCUMENTS

| | | | |
|---|---|---|---|
| 6,724,235 B2 | 4/2004 | Costa et al. | 327/378 |
| 6,961,552 B2 | 11/2005 | Darabi et al. | 455/241.1 |
| 7,242,915 B2 | 7/2007 | Shi | 455/232.1 |
| 7,847,613 B1 * | 12/2010 | Samavati | H03L 7/099 327/355 |
| 8,050,643 B1 | 11/2011 | Wu et al. | 455/234.1 |
| 2006/0187360 A1 * | 8/2006 | Hutchinson | H03G 3/3052 348/733 |
| 2008/0130603 A1 * | 6/2008 | Wentink | H04W 74/085 370/338 |

(Continued)

OTHER PUBLICATIONS

Taiwan Office Action, Application No. 103113889, 8 pages, Mar. 17, 2016.

(Continued)

*Primary Examiner* — Ping Hsieh
*Assistant Examiner* — James Yang
(74) *Attorney, Agent, or Firm* — Slayden Grubert Beard PLLC

(57) ABSTRACT

An exemplary embodiment of a method illustrates a gain control method executed in a wireless signal receiver. The gain control method has the following steps. A wideband channel is continuously monitored to check whether an interference signal exists in a wireless signal. When the interference signal exists in the wireless signal, an interference received signal strength indicator is obtained. A front end gain of the wireless signal receiver is controlled according to the interference received signal strength indicator. When the interference signal exists in the wireless signal, the wireless signal receiver is prohibited from using a maximum front end gain.

10 Claims, 6 Drawing Sheets

(56) References Cited

U.S. PATENT DOCUMENTS

2011/0007780 A1* 1/2011 Shimoni ............. H03G 3/3068
375/136
2012/0034894 A1* 2/2012 Chan ................... H03G 3/3078
455/246.1

OTHER PUBLICATIONS

Taiwan Office Action, Application No. 103113889, 8 pages, Jul. 7, 2016.

* cited by examiner

GAIN CONTROL METHOD, MODULE, AND WIRELESS SIGNAL RECEIVER USING THE SAME

BACKGROUND

1. Technical Field

The present disclosure relates to a wireless signal receiver, in particular to a gain control method and module in the wireless signal receiver.

2. Description of Related Art

Currently, the communication technology develops fast, and the marketed receiver can simultaneously support different wireless communication standards, wherein the wireless communication standards are for example, wireless standards of IEEE 802.11 series, third generation mobile communication standard, and blue-tooth (BT) communication standard. The IEEE 802.11 standard based wireless local area network (WLAN) device can be the wireless fidelity (WiFi) device after being authorized. Thus, the wireless signals of the wireless wideband network may be a WiFi signal, a BT wireless signal, and/or a third generation mobile communication signal.

At least two of the above wireless signals may be simultaneously transmitted, and thus the different wireless signals may interfere with each other. When the wireless signal is to be received, the wireless signal receiver can pre-detect whether the interference signal will interfere with the wireless signal to be received. When that the interference signal will interfere with the wireless signal to be received is determined, the wireless signal receiver usually decreases the gain of the amplifier thereof, so as to avoid front end overload from causing the interference signal to damage the wireless signal to be received.

Referring to FIG. 1, FIG. 1 is a block diagram of a conventional wireless signal receiver. The conventional wireless signal receiver 1 comprises an antenna 11, a first amplifier 12, a mixer 13, a band-pass filter 14, a switch 15, a second amplifier 16, an analog-digital converter (ADC) 17 and a base band/digital signal processing (BB/DSP) circuit 18. The antenna 11 is electrically connected to the first amplifier 12, and the first amplifier 12 is electrically connected to the mixer 13. The mixer 13 is electrically connected to the band-pass filter 14 and the switch 15, and the band-pass filter 14 and the switch 15 are electrically connected to the second amplifier 16. The second amplifier 16 is electrically connected to the ADC 17, and the ADC 17 is electrically connected to the BB/DSP circuit 18, and the BB/DSP circuit 18 is electrically connected to the first amplifier 12 and the second amplifier 16.

The antenna 11 is used to receive a wireless signal and to transmit the received wireless signal to the first amplifier 12. The first amplifier 12 can be a front end amplifier, such as a low noise amplifier (LNA), and is used to amplify the received wireless signal based on a first gain (i.e. front end gain) to generate a first amplified signal to the mixer 13. The mixer 13 receives a local oscillating signal LO and the first amplified signal, and mixes the local oscillating signal LO and the first amplified signal to generate mixed signal.

When the conventional wireless signal receiver 1 pre-detects whether the interference signal will interfere with the wireless signal to be received, the switch 15 is turned on, and thus the mixed signal does not pass the band-pass filter 14. When the conventional wireless signal receiver 1 has pre-detected whether the interference signal will interfere with the wireless signal to be received, the switch 15 is turned off, and thus the mixed signal passes the band-pass filter 14. The band-pass filter 14 performs band-pass filtering on the mixed signal to generate a band-pass signal.

The second amplifier 16 can be a variable gain amplifier (VGA). According to the turned-on or turned-off state of the switch 15, the second amplifier 16 amplifies the mixed signal or band-pass signal based on the second gain to generate a second amplified signal. To put it concretely, when the switch 15 is turned on, the second amplifier 16 amplifies the mixed signal based on the second gain; when the switch 15 is turned off, the second amplifier 16 amplifies the band-pass signal based on the second gain.

The ADC 17 performs analog-digital conversion on the second amplified signal to generate a digital output signal. The BB/DSP circuit 18 receives the digital output signal, and performs digital signal processing on the digital output signal to generate a first gain control signal and a second gain control signal. The first amplifier 12 can adjust the first gain thereof according to the first gain control signal, and the second amplifier 16 can adjust the second gain thereof according to the second gain control signal.

Referring to FIG. 1 and FIG. 2, FIG. 2 is a schematic diagram showing the wireless signal received by the conventional wireless signal receiver is interfered by the interference wireless signal. In FIG. 2, the wireless signal which will be received by the conventional wireless signal receiver 1 can be the BT packet. Firstly, the conventional wireless signal receiver 1 performs synchronization lock, wherein the consuming time for synchronization lock is 65 µs.

Next, the switch 15 is turned on, and maintains for 15 µs, and the second amplifier 16 amplifies the mixed signal in the 15 µs. Meanwhile, when the WiFi interference 23 exists, the mixed signal is the result which the WiFi interference 23 and wideband received signal strength indicator (RSSI) 21 mix with the local oscillating signal LO. The BB/DSP circuit 18 can determine whether WiFi interference 23 interferes with the BT packet to be received according to the digital output signal, and outputs the first gain control signal to decrease the first gain of the first amplifier 12.

Next, when the switch 15 is turned off, the conventional wireless signal receiver 1 consumes about 50 µs or more to perform auto-gain control (AGC). After the AGC is performed, the conventional wireless signal receiver 1 is able to start to obtain the payload of the BT packet.

When obtaining the payload or performing the AGC (p.s. the second amplifier 16 now amplifies the band-pass signal), if the WiFi interference 24 exists, the mixed signal is the results which the WiFi interference 24 and the narrow band RSSI 22 mix with the local oscillating signal LO. Since the amount of the WiFi interference 24 existed in the band-pass signal is less, the BB/DSP circuit 18 cannot determine that the WiFi interference 24 interferes with the currently received BT packet according to the digital output signal, the first gain does not decrease, and it causes the front end overload (i.e. the WiFi interference 24 will damage the currently received BT packet).

SUMMARY

An exemplary embodiment of the present disclosure provides a gain control method executed in a wireless signal receiver. The gain control method includes the following steps. A wideband channel is continuously monitored to check whether an interference signal exists in a wireless signal. When the interference signal exists in the wireless signal, an interference RSSI is obtained. A front end gain of the wireless signal receiver is controlled according to the interference RSSI. When the interference signal exists in the wireless signal, the wireless signal receiver is prohibited from using a maximum front end gain.

An exemplary embodiment of the present disclosure provides a gain control module comprising an amplifier, a wideband radio frequency (RF) impulse detector, an ADC and a BB/DSP circuit, wherein the wideband RF impulse detector is electrically connected to the amplifier, the ADC is electrically connected to the wideband RF impulse detector, and the BB/DSP circuit is electrically connected to the ADC. The amplifier is used to amplify a wireless signal. The wideband RF impulse detector is used to continuously monitor whether an interference signal exists in the wireless signal. The ADC is used performs analog-digital conversion on the interference signal to generate an interference RSSI. The BB/DSP circuit controls a front end gain of a wireless signal receiver according to the interference RSSI. The BB/DSP circuit prohibits the wireless signal receiver to from using a maximum front end gain when the interference signal exists in the wireless signal.

An exemplary embodiment of the present disclosure provides a wireless signal receiver comprising a signal receiving module and a gain control module, wherein the gain control module is electrically connected to the signal receiving module. The signal receiving module is used to receive a wireless signal, and to perform front end amplification, mixing, band-pass filtering, analog-digital conversion, and digital signal processing on the wireless signal. The gain control module is used to continuously monitor a wideband to check whether an interference signal exists in the wireless signal, and to control a front end gain of the wireless signal receiver accordingly. The gain control module prohibits the wireless signal receiver from using a maximum front end gain when the interference signal exists in the wireless signal.

To sum up, the gain control method, module, and the wireless signal receiver using the same provided by the exemplary embodiments of the present disclosure can instantly detect whether the interference signal exists on the wideband channel, and the maximum front end gain is prohibited from amplifying the wireless signal on which the band-pass filtering is not performed, so as to avoid the front end overload.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
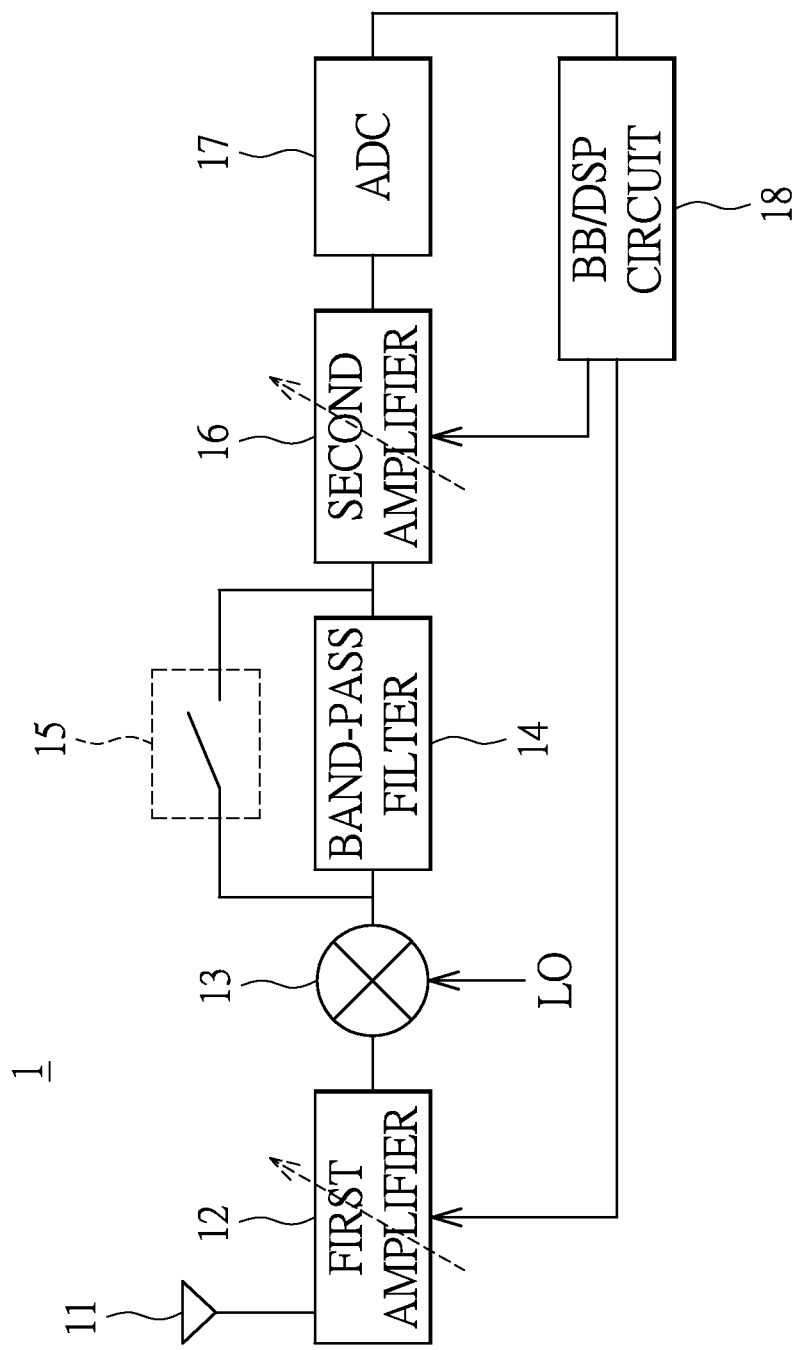
FIG. 1 is a block diagram of a conventional wireless signal receiver.
Figure 2:
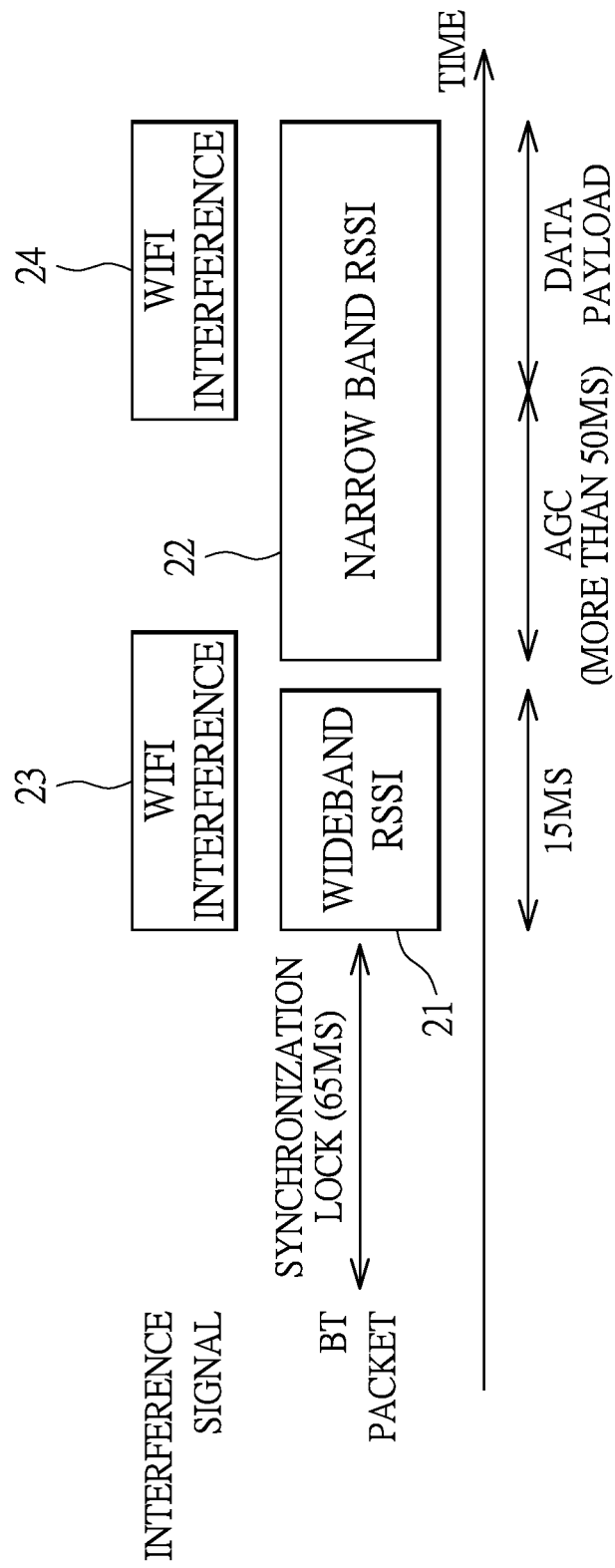
FIG. 2 is a schematic diagram showing the wireless signal received by the conventional wireless signal receiver is interfered by the interference wireless signal.

Reference will now be made in detail to the exemplary embodiments of the present disclosure, examples of which are illustrated in the accompanying drawings. Wherever possible, the same reference numbers are used in the drawings and the description to refer to the same or like parts.

Exemplary embodiments of the present disclosure provide a gain control method and module, and the gain control method and module monitors a wideband channel to check whether the interference signal exists on the wideband channel. When that the interference signal exists on the wideband channel is determined, the gain control method and module prohibits the front end amplifier of the wireless signal receiver from using the maximum front end gain, so as to avoid the front end overload. In another exemplary embodiment, the gain control method and module further determine an interference score according to the interference signal, and adjust the front end gain of the wireless signal receiver according to interference score.

Figure 3:
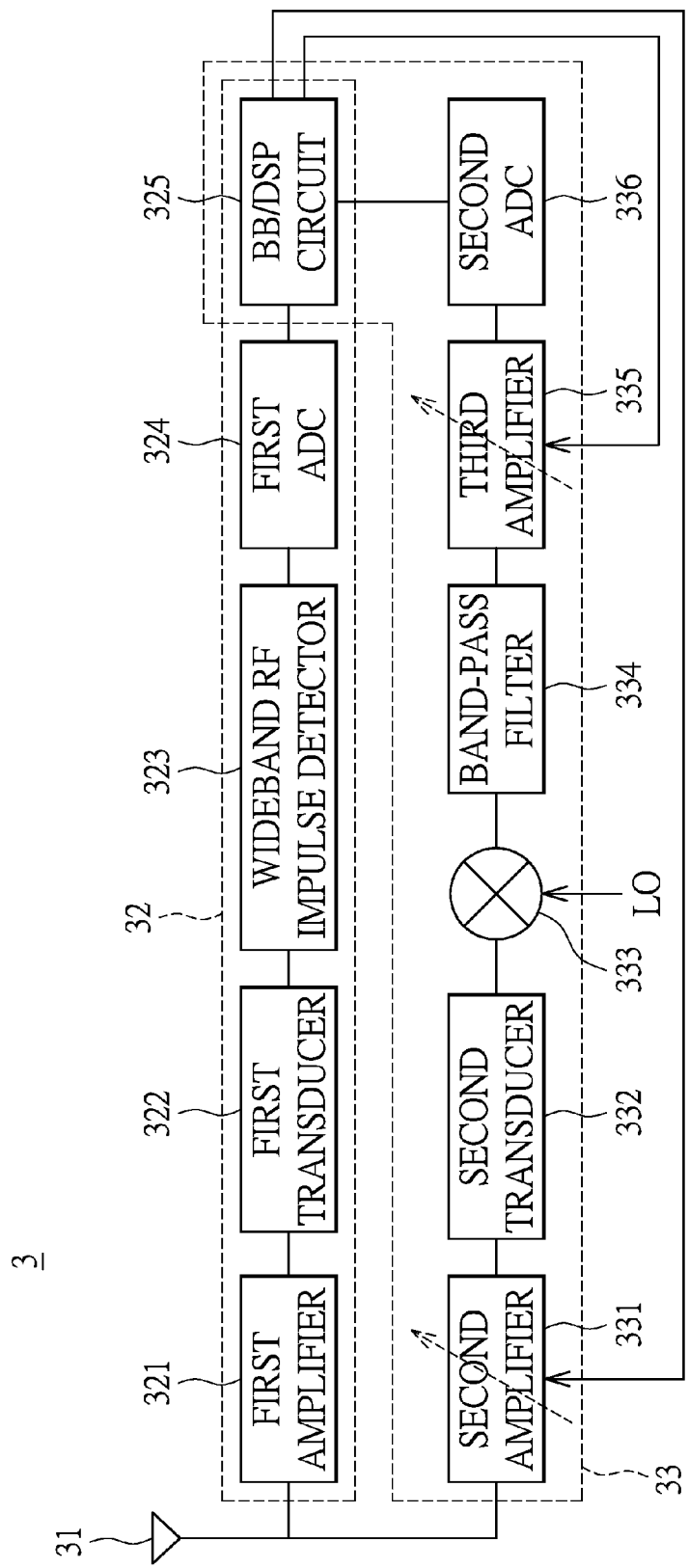
FIG. 3 is a block diagram of a wireless signal receiver according to an exemplary embodiment of the present disclosure.

Referring to FIG. 3, FIG. 3 is a block diagram of a wireless signal receiver according to an exemplary embodiment of the present disclosure. The wireless signal receiver 3 comprises an antenna 31, a gain control module 32, and a signal receiving module 33, wherein the antenna 31 is electrically connected to the gain control module 32 and the signal receiving module 33, and the gain control module 32 is electrically connected to the signal receiving module 33.

The antenna 31 is used to receive the wireless signal, and to transmit the wireless signal to the gain control module 32 and the signal receiving module 33 simultaneously. The signal receiving module 33 performs front end amplification (amplification based on the front end gain), mixing, band-pass filtering, fine tuning amplification, and analog-digital conversion on the wireless signal sequentially, so as to generate a narrow band digital output signal. Then, the signal receiving module 33 performs digital signal processing on the digital output signal to generate a digital signal processed signal to the rear circuit electrically connected to the wireless signal receiver 3.

The gain control module 32 is used to perform the front end amplification on the wireless signal, and detects whether the interference signal exists in the wireless signal, so as to generate the interference RSSI correspondingly. Next, the gain control module 32 controls the front end gain of the signal receiving module 33 according to the interference RSSI. When the interference RSSI indicates the interference signal exists in the wireless signal, the gain control module 32 transmit a gain control signal to the signal receiving module 33, so as to prohibit from using the maximum front end gain. In addition, in another exemplary embodiment of the present disclosure, the gain control module 32 can update the interference score according to the interference signal, and then adjust the front end gain of the signal receiving module 33 according to the interference score.

Next, one implementation of the gain control module 32 is illustrated. However, the illustrated implementation of gain control module 32 is not used to limit the present disclosure.

The gain control module 32 comprises a first amplifier 321, a first transducer 322, a wideband RF impulse detector 323, a first ADC 324, and a BB/DSP circuit 325. The first amplifier 321 is electrically connected to the first transducer 322, and the first transducer 322 is electrically connected to the wideband RF impulse detector 323. The wideband RF impulse detector 323 is electrically connected the first ADC 324, and the first ADC 324 is electrically connected to the BB/DSP circuit 325. In addition, the BB/DSP circuit 325 is electrically connected to the front end amplifier and fine tuning amplifier of the signal receiving module 33.

The first amplifier 321 is used to amplify the wireless signal based on the first gain, to generate a first amplified signal to the first transducer 322. The first transducer 322 is used to perform transduction on the first amplified signal, so as to generate a first current signal to the wideband RF impulse detector 323. The wideband RF impulse detector 323 is used to monitor wideband channel to check whether the interference signal exists in the wireless signal. The first ADC 324 receives the interference signal, and performs the analog-digital conversion on the interference signal to generate the interference RSSI to the BB/DSP circuit 325.

The BB/DSP circuit 325 adjusts the front end gain of the signal receiving module 33 according to the interference RSSI, and further adjusts the fine tuning gain of the signal receiving module 33. When the interference RSSI indicates the interference signal exists in the wireless signal, the BB/DSP circuit 325 prohibits the signal receiving module 33 from using the maximum front end gain, such that the front end overload is avoided. In the exemplary embodiment, the BB/DSP circuit 325 can further update the interference score according to the interference RSSI, and then adjust the front end gain of the signal receiving module 33 according to the interference score.

Next, one implementation of the signal receiving module 33 is illustrated. However, the illustrated implementation of signal receiving module 33 is not used to limit the present disclosure.

The signal receiving module 33 comprises a second amplifier 331, a second transducer 332, a mixer 332, a band-pass filter 334, a third amplifier 335, a second ADC 336, and the above BB/DSP circuit 325 (i.e. the gain control module 32 and the signal receiving module 33 shares the BB/DSP circuit 325). The second amplifier 331 is electrically connected to the second transducer 332, and the second transducer 332 is electrically connected to the mixer 332. The mixer 332 is electrically connected to the band-pass filter 334, and the band-pass filter 334 is electrically connected to the third amplifier 335. The third amplifier 335 is electrically connected to the second ADC 336, and the second ADC 336 is electrically connected to the BB/DSP circuit 325. In addition, the BB/DSP circuit 325 is further electrically connected to the second amplifier 331 and the third amplifier 335.

The second amplifier 331 is a front end amplifier, for example, a LNA, and can amplify the received wireless signal based on the second gain (i.e. the front end gain) to generate the second amplified signal to the second transducer 332. The second transducer 332 performs transduction on the second amplified signal, so as to generate a second current signal to the mixer 33. The mixer 333 receives the local oscillating signal LO and the second current signal, and mixes the local oscillating signal LO and the second current signal to generate the mixed signal.

The band-pass filter 334 performs band-pass filtering on the mixed signal to generate the band-pass signal. The third amplifier 335 can be the VGA, and amplify band-pass signal based on the third gain (i.e. fine tuning gain) to generate the third amplified signal. The second ADC 336 performs analog-digital conversion on the third amplified signal to generate the digital output signal. The BB/DSP circuit 325 receives the digital output signal, and performs digital signal processing on digital output signal to generate a digital signal processed signal to the rear circuit electrically connected to the wireless signal receiver 3.

Figure 4:
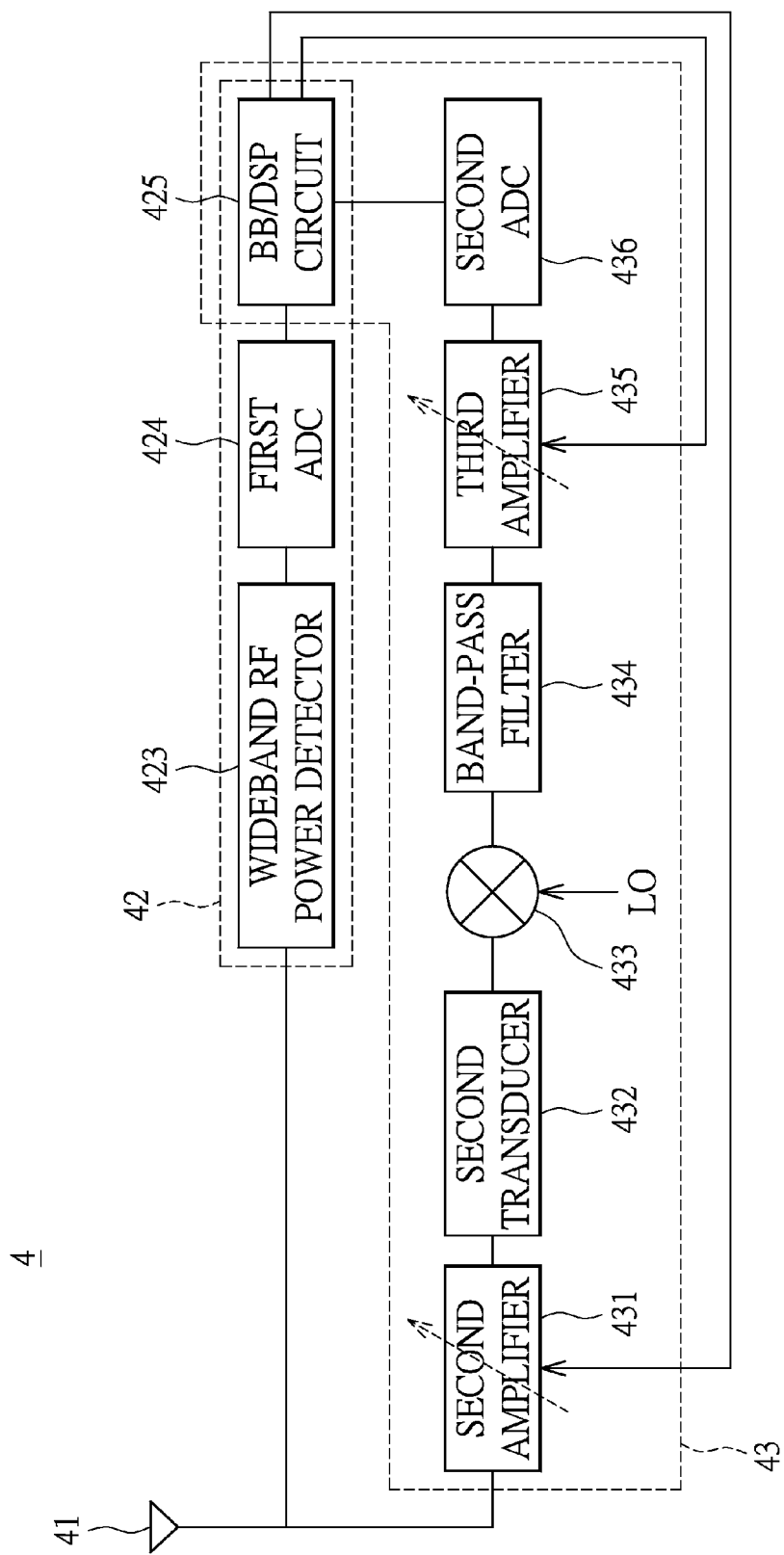
FIG. 4 is another block diagram of a wireless signal receiver according to another exemplary embodiment of the present disclosure.

Referring to FIG. 4, FIG. 4 is another block diagram of a wireless signal receiver according to another exemplary embodiment of the present disclosure. Compared to the exemplary embodiment of the FIG. 3, the gain control module 42 has a wideband RF power detector 423 but does not have the first amplifier, the first transducer, and the wideband RF impulse detector.

The wideband RF power detector 423 directly detects the power of interference source in the wideband, and thus generates the interference signal to the first ADC 424. The first ADC 424 performs the analog-digital conversion on the interference signal to generate the interference RSSI to the first BB/DSP circuit 425. The first BB/DSP circuit 425 is electrically connected to the second amplifier 431 and the third amplifier 435, so as to adjust the second gain (front end gain) of the second amplifier 431 and the third gain (fine tuning gain) of the third amplifier 435. The second BB/DSP circuit 437 performs digital signal processing on digital output signal to generate a digital signal processed signal to the rear circuit electrically connected to the wireless signal receiver 4.

Furthermore, functions and connections of the first ADC 424, the BB/DSP circuit 425, the second amplifier 431, the second transducer 432, the mixer 433, the band-pass filter 434, the third amplifier 435, and the second analog-digital converter 436 are the same as those of the first ADC 324, the BB/DSP circuit 325, the second amplifier 331, the second transducer 332, the mixer 333, the band-pass filter 334, the third amplifier 335, and the second ADC 336 in FIG. 3, and the redundant descriptions are omitted.

Figure 5:
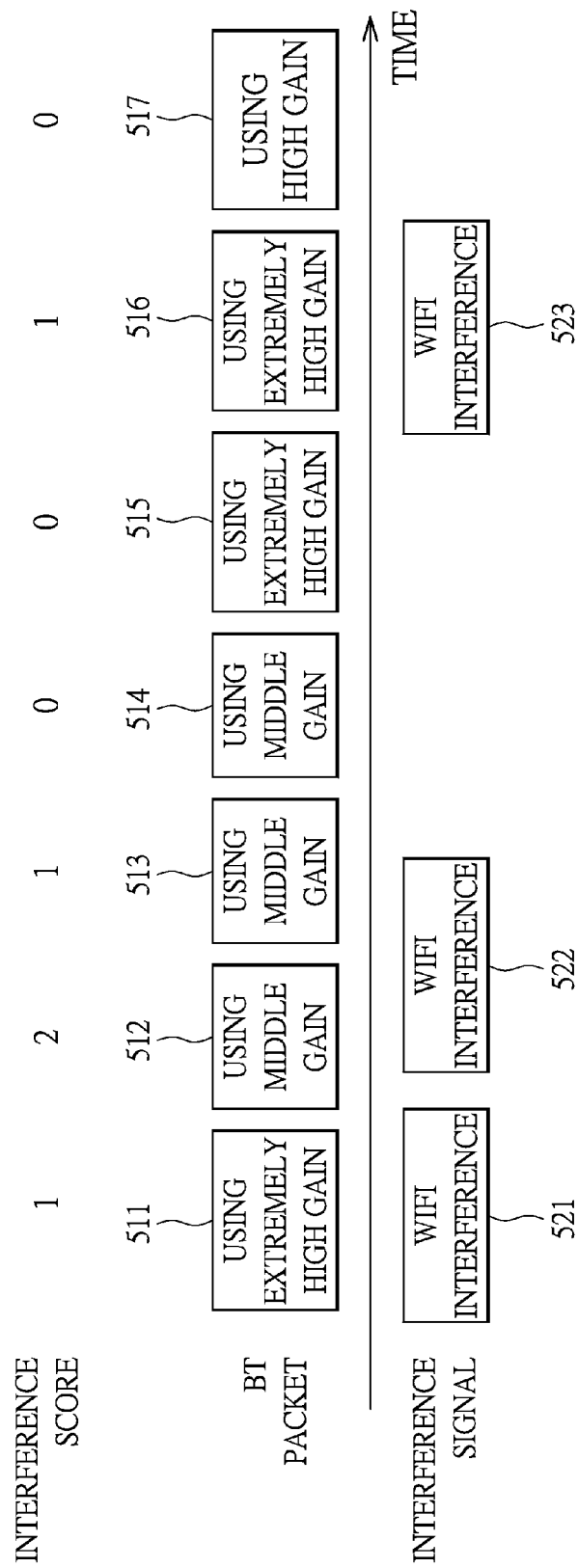
FIG. 5 is a schematic diagram showing the wireless signal received by the wireless signal receiver is interfered by the interference wireless signal according to an exemplary embodiment of the present disclosure.

Referring to FIG. 5, FIG. 5 is a schematic diagram showing the wireless signal received by the wireless signal receiver is interfered by the interference wireless signal according to an exemplary embodiment of the present disclosure. In the exemplary embodiment, the front end gain can the extremely high gain, high gain, middle gain, or low gain, and when the interference RSSI indicates that the interference signal (such as the WiFi interference, however, the present disclosure does not limit the type of the interference signal) exists in the wireless signal, the interference score adds 1.

In FIG. 5, firstly, the wireless signal received by the wireless signal receiver merely has the BT packet 511 (however, the present disclosure does not limit the type of the wireless signal), and thus front end gain can be the extremely high gain for amplifying the currently received BT packet 511. Next, the wireless signal receiver detects that the WiFi interference 521 exists in the wireless signal, the interference score is updated to be 1 from 0, and the wireless signal receiver adjusts the front end gain to be the middle gain for amplifying the BT packet 512 to be received. It is noted that, the WiFi interference 521 is detected during reception of the BT packet 511. The BT packet 511 is amplified by the extremely high gain, and the BT packet 511 may be discarded, but the interference score is updated to be 1 from 0, such that the next received BT packet 512 will not be amplified by the extremely high gain.

In duration of receiving the BT packet 512, the wireless signal receiver detects the WiFi interference 522 exists in the wireless signal, the interference score is updated to be 2 from 1, and the front end gain can still be the middle gain for amplifying the BT packet 513 to be received.

In duration of receiving the BT packet 513, no WiFi interference exists in the wireless signal, the interference score is updated to be 1 from 2, and the front end gain can still be the middle gain for amplifying the BT packet 514 to be received. Next, in duration of receiving the BT packet 514, no WiFi interference exists in the wireless signal, the interference score is updated to be 0 from 1, and the front end gain can be adjusted to be the extremely high gain for amplifying the BT packet 515 to be received. In duration of receiving the BT packet 515, no WiFi interference exists in the wireless signal, the interference score maintains 0, and the front end gain can still be the extremely high gain for amplifying the BT packet 516 to be received.

In duration of receiving the BT packet 516, the wireless signal receiver detects the WiFi interference 523 exists in the wireless signal, the interference score is updated to be 1 from 0, and the front end gain can be adjusted to be the high gain for amplifying the BT packet 517 to be received. It is noted that, the WiFi interference 523 is detected during reception of the BT packet 516. The BT packet 516 is amplified by the extremely high gain, and the BT packet 516 may be discarded, but the interference score is updated to be 1 from 0, such that the next received BT packet 517 will not be amplified by the extremely high gain.

In duration of receiving the BT packet 517, no WiFi interference exists in the wireless signal, the interference score is updated to be 0 from 1, and the front end gain can be adjusted to be the extremely high gain for amplifying the BT packet (not shown in drawings) to be received. From the above descriptions, it can be known that when the interference score is larger than 0, the wireless signal receiver controls the front end gain not to be the extremely high gain (i.e. the maximum front end gain) for amplifying the BT packet to be received, such that the front end overload is prevented.

It is noted that the implementations of the exemplary embodiment of FIG. 5 is not used to limit the present disclosure. For example, the front end gain may be one of two or more possible gains, the interference RSSI can be used to indicate different amplitudes of the interference signal, and the decrement or increment of the interference score can be corresponding to the amplitude of the interference signal.

Figure 6:
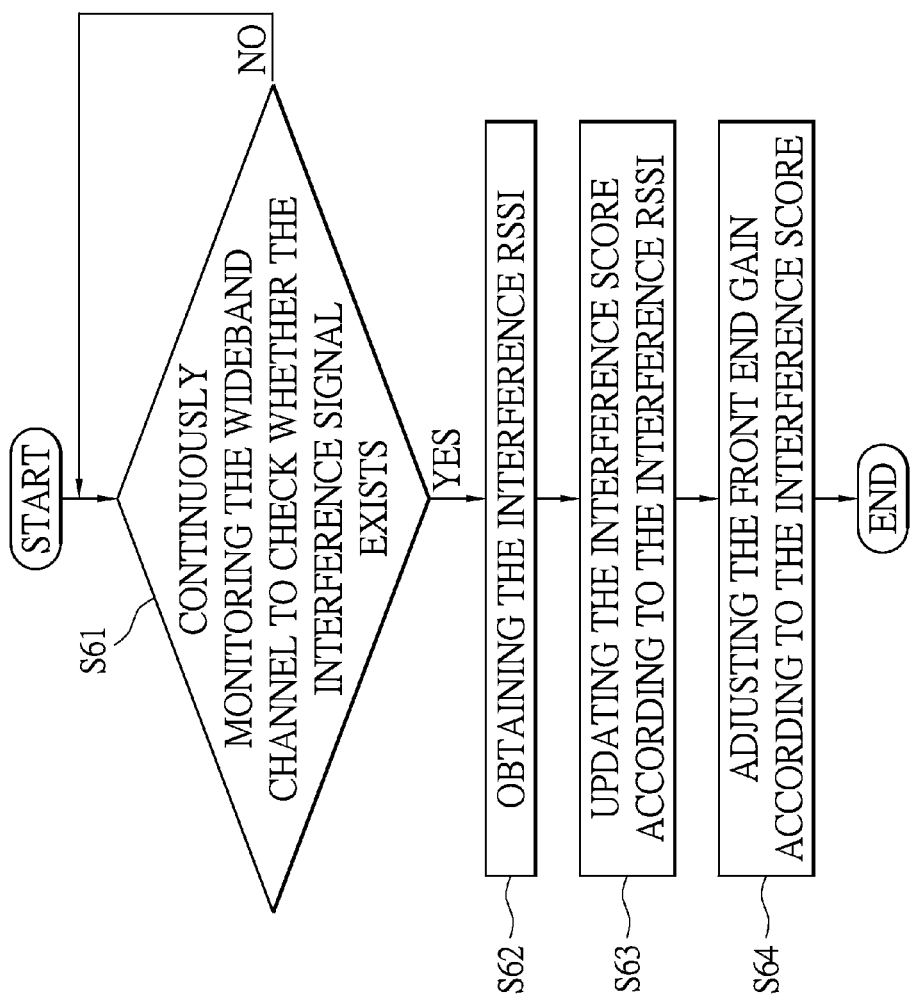
FIG. 6 is a flowchart of a gain control method according to an exemplary embodiment of the present disclosure.

Referring to FIG. 6, FIG. 6 is a flowchart of a gain control method according to an exemplary embodiment of the present disclosure. The gain control method is executed in the wireless signal receiver, wherein the wireless signal receiver is used to receive the wireless signal of the BT packet, and the present disclosure does not limit the type of the wireless signal. Firstly, at step S61, the gain control module of the wireless signal receiver continuously monitors the wideband channel to check whether an interference signal exists in a wireless signal. When the interference signal exists in the wireless signal, step S62 will be executed. When the interference signal does not exist in the wireless signal, the gain control module of the wireless signal receiver still monitors the wideband channel at step S61.

At step S62, the gain module of the wireless signal receiver obtains the interference RSSI. Next, at step S63, the gain module of the wireless signal receiver updates the interference score according to the interference RSSI. Then, at step S64, the gain module of the wireless signal receiver adjusts a front end gain of the wireless signal receiver according to the interference score, wherein when interference RSSI indicates the interference signal exists in the wireless signal, the wireless signal receiver is prohibited from using the maximum front end gain. Take FIG. 5 as example, the maximum front end gain is prohibited further when the interference score is not equal to 0.

In addition, the gain control method in FIG. 5 is not used to limit the present disclosure. As mentioned above, in another exemplary embodiment, the gain control module of the wireless signal receiver can adjust the front end gain according to whether the interference RSSI indicates the interference signal exists in the wireless signal, without updating the interference score according to the interference RSSI.

To sum up, the gain control method, module, and the wireless signal receiver thereof in the exemplary embodiments can continuously monitor the wideband channel check whether an interference signal interferes with the wireless signal to be received, and when interference signal exists on the wideband channel, the front end gain is adjusted, such that the maximum front end gain is prohibited, and the front end overload can be prevented. In addition, the implementation complexity and cost of the gain control method and module are not high, and thus the wireless signal receiver using the same has competitive advantage in the current market.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:
1. A gain control method, executed in a wireless signal receiver, comprising:
continuously monitoring a wideband channel to check whether an interference signal exists in a wireless signal;
obtaining an interference received signal strength indicator (RSSI) when the interference signal exists in the wireless signal; and
controlling a front end gain of the wireless signal receiver according to the interference RSSI;
wherein:
the wireless signal receiver is prohibited from using a maximum front end gain when the interference signal exists in the wireless signal;
an interference score is updated according to the interference RSSI;
the front end gain of the wireless signal receiver is determined by the interference score; and
the interference score is increased by 1 when the interference signal exists in the wireless signal, and the interference score is decreased by 1 when the interference signal does not exist in the wireless signal, wherein a lowest interference score is equal to 0, and the wireless signal receiver is prohibited from using the maximum front end gain when the interference score is not equal to 0.

2. The gain control method according to claim 1, wherein the wideband channel is still continuously monitored to check whether the interference signal exists in the wireless signal when the interference signal does not exist in the wireless signal.

3. The gain control method according to claim 1, wherein the wireless signal receiver is designed to receive a short range wireless communication packet, and the interference signal is a wireless local area network interference.

4. A gain control module, comprising:
an amplifier configured to amplify a wireless signal;
a wideband radio frequency (RF) impulse detector, electrically connected to the amplifier, configured to continuously monitor whether an interference signal exists in the wireless signal;
an analog-digital converter (ADC), electrically connected to the wideband RF impulse detector, configured to perform analog-digital conversion on the interference signal to generate an interference RSSI; and
a base band/digital signal processing (BB/DSP) circuit, electrically connected to the ADC, configured to control a front end gain of a wireless signal receiver according to the interference RSSI;
wherein the BB/DSP circuit is configured to:
 prohibit the wireless signal receiver to from using a maximum front end gain when the interference signal exists in the wireless signal;
 update an interference score according to the interference RSSI;
 determine the front end gain of the wireless signal receiver according to the interference score; and
 add 1 to the interference score with when the interference signal exists in the wireless signal;
 subtract 1 from the interference score when the interference signal does not exist in the wireless signal; and
 prohibit the wireless signal receiver from using the maximum front end gain when the interference score is not equal to 0, wherein a lowest interference score is equal to 0.

5. The gain control module according to claim 4, further comprising:
a transducer, electrically connected between the amplifier and the wideband RF impulse detector, configured to convert the wireless signal to a current signal to the wideband RF impulse detector.

6. The gain control module according to claim 4, wherein the wireless signal receiver is configured to receive a short range wireless communication packet, and the interference signal is a wireless local area network interference.

7. A wireless signal receiver, comprising:
a signal receiving circuit, configured to receive receiving a wireless signal, and perform front end amplification, mixing, band-pass filtering, analog-digital conversion, and digital signal processing on the wireless signal; and
a gain control circuit, electrically connected to the signal receiving circuit, configured to continuously monitor a wideband to check whether an interference signal exists in the wireless signal, and control a front end gain of the wireless signal receiver accordingly;
wherein the gain control circuit is configured to:
 prohibit the wireless signal receiver from using a maximum front end gain when the interference signal exists in the wireless signal;
 update an interference score according to the interference RSSI;
 determine the front end gain of the wireless signal receiver according to the interference score; and
 add 1 to the interference score with when the interference signal exists in the wireless signal;
 subtract 1 from the interference score when the interference signal does not exist in the wireless signal; and
 prohibit the wireless signal receiver from using the maximum front end gain when the interference score is not equal to 0, wherein a lowest interference score is equal to 0.

8. The wireless signal receiver according to claim 7, wherein the gain control circuit comprises:
an amplifier, configured to amplify the wireless signal;
a wideband RF impulse detector, electrically connected to the amplifier, configured to continuously monitor whether the interference signal exists in the wireless signal;
an ADC, electrically connected to the wideband RF impulse detector, configured to perform the analog-digital conversion on the interference signal to generate an interference RSSI; and
a BB/DSP circuit, electrically connected to the ADC, configured to control the front end gain of the wireless signal receiver according to the interference RSSI;
wherein the BB/DSP circuit is configured to:
 prohibit the wireless signal receiver from using the maximum front end gain when the interference signal exists in the wireless signal.

9. The wireless signal receiver according to claim 8, wherein the gain control circuit further comprises:
a transducer, electrically connected between the amplifier and the wideband RF impulse detector, configured to convert the wireless signal to a current signal to the wideband RF impulse detector.

10. The wireless signal receiver according to claim 7, wherein the wireless signal receiver is configured to receive a short range wireless communication packet, and the interference signal is a wireless local area network interference.

* * * * *